US009368289B2

(12) United States Patent
Jin et al.

(10) Patent No.: US 9,368,289 B2
(45) Date of Patent: Jun. 14, 2016

(54) THREE DIMENSIONAL DYE-SENSITIZED SOLAR CELLS WITH NANOSCALE ARCHITECTURES

(75) Inventors: Sungho Jin, San Diego, CA (US); Michael J. Tauber, San Diego, CA (US); Christine Frandsen, La Jolla, CA (US); Cyrus Rustomji, La Jolla, CA (US); Cheong-Kyun Ryoo, Icheon (KR)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/263,745

(22) PCT Filed: Apr. 9, 2010

(86) PCT No.: PCT/US2010/030612
§ 371 (c)(1),
(2), (4) Date: Oct. 9, 2011

(87) PCT Pub. No.: WO2010/118375
PCT Pub. Date: Oct. 14, 2010

(65) Prior Publication Data
US 2012/0199189 A1 Aug. 9, 2012

Related U.S. Application Data

(60) Provisional application No. 61/168,118, filed on Apr. 9, 2009.

(51) Int. Cl.
*H01L 31/00* (2006.01)
*H01G 9/20* (2006.01)
*H01L 51/00* (2006.01)

(52) U.S. Cl.
CPC ........... *H01G 9/2068* (2013.01); *H01G 9/2031* (2013.01); *H01G 9/2086* (2013.01);
(Continued)

(58) Field of Classification Search
CPC . H01G 9/2031; H01G 9/2068; H01G 9/2072; H01G 9/2059; Y02E 10/542
USPC .......................................................... 136/263
See application file for complete search history.

(56) References Cited

U.S. PATENT DOCUMENTS

2003/0150485 A1    8/2003 Koyanagi et al.
2005/0109385 A1    5/2005 Kim et al.
(Continued)

FOREIGN PATENT DOCUMENTS

EP           1237166 A2    9/2002
JP        2006324111 A    11/2006
(Continued)

OTHER PUBLICATIONS

Baxter, J.B., et al., "Nanowire-based dye-sensitized solar cells," Applied Physics Letters, 86(5):053114.1-053114.3, Jan. 2005.
(Continued)

*Primary Examiner* — Marla D. McConnell
*Assistant Examiner* — Dujuan Horton
(74) *Attorney, Agent, or Firm* — Perkins Coie LLP (57) ABSTRACT

Techniques, apparatus, materials and systems are described for providing solar cells. In one aspect, an apparatus includes a high efficiency dye sensitized solar cell (DSSC). The DSSC includes three-dimensional nanostructured electrodes. The three-dimensional nanostructured electrodes can include a cathode; an electrolyte; and anode that includes $TiO_2$ nanotubes arranged in a three-dimensional structure; and a photosensitive dye coated on the anode.

25 Claims, 11 Drawing Sheets

(52) U.S. Cl.
CPC .......... *H01G9/2059* (2013.01); *H01L 51/0053* (2013.01); *H01L 51/0086* (2013.01); *Y02E 10/542* (2013.01); *Y02P 70/521* (2015.11)

(56) References Cited

U.S. PATENT DOCUMENTS

| | | | |
|---|---|---|---|
| 2006/0021647 A1* | 2/2006 | Gui et al. | 136/252 |
| 2007/0194467 A1 | 8/2007 | Yang et al. | |
| 2007/0251574 A1* | 11/2007 | Fujimaki et al. | 136/263 |
| 2008/0011351 A1 | 1/2008 | Diau et al. | |
| 2008/0041446 A1* | 2/2008 | Wu et al. | 136/263 |
| 2008/0110494 A1 | 5/2008 | Reddy | |
| 2008/0292789 A1 | 11/2008 | Sun et al. | |
| 2009/0114273 A1 | 5/2009 | Kamat | |

FOREIGN PATENT DOCUMENTS

| | | |
|---|---|---|
| KR | 10-2009-0022956 | 3/2009 |
| WO | 2007138348 A2 | 12/2007 |

OTHER PUBLICATIONS

Grätzel, M., "Photoelectrochemical cells," Nature, 414(6861):338-344, Nov. 2001.

Grimes, C.A., "Synthesis and application of highly ordered arrays of TiO2 nanotubes," Journal of Materials Chemistry, 17(15):1451-1457, Mar. 2007.

International Search Report and Written Opinion mailed on Nov. 18, 2010 for International Application No. PCT/US2010/030612, filed Apr. 9, 2010 (7 pages).

Jennings, J.R., et al., "Dye-Sensitized Solar Cells Based on Oriented TiO2 Nanotube Arrays: Transport, Trapping, and Transfer of Electrons," Journal of the American Chemical Society, 130(40):13364-13372, Oct. 2008.

Jiu, J.T., et al., "Dye-Sensitized Solar Cells Based on a Single-Crystalline TiO2 Nanorod Film," The Journal of Physical Chemistry B, 110(5):2087-2092, Feb. 2006.

Kongkanand, A., et al., "Quantum Dot Solar Cells. Tuning Photoresponse through Size and Shape Control of CdSe-TiO2 Architecture," Journal of the American Chemical Society, 130(12):4007-4015, Mar. 2008.

Kongkanand, A., et al., "Single Wall Carbon Nanotube Scaffolds for Photoelectrochemical Solar Cells. Capture and Transport of Photogenerated Electrons," Nano Letters, 7(3):676-680, Feb. 2007.

Kroon, J.M., et al., "Nanocrystalline Dye-Sensitized Solar Cells Having Maximum Performance," Progress in Photovoltaics: Research and Applications, 15(1):1-18, Jan. 2007.

Law, M., et al., "Nanowire dye-sensitized solar cells," Nature Materials, 4(6):455-459, Jun. 2005.

Li, C., et al., "An Improved Perylene Sensitizer for Solar Cell Applications," ChemSusChem, 1(7):615-618, Jul. 2008.

Murakami, T.N., et al., "Highly Efficient Dye-Sensitized Solar Cells Based on Carbon Black Counter Electrodes," Journal of the Electrochemical Society, 153(12):A2255-A2261, Oct. 2006.

Nazeeruddin, M.K., et al., "Combined Experimental and DFT-TDDFT Computational Study of Photoelectrochemical Cell Ruthenium Sensitizers," Journal of the American Chemical Society, 127(48):16835-16847, Nov. 2005.

O'Regan, B., et al., "A low-cost, high-efficiency solar-cell based on dye-sensitized colloidal TiO2 films," Nature, 353 (6346):737-740, Oct. 1991.

Paulose, M., et al., "Backside illuminated dye-sensitized solar cells based on titania nanotube array electrodes," Nanotechnology, 17(5):1446-1448, Mar. 2006.

Paulose, M. et al., "TiO2 Nanotube Arrays of 1000 μm Length by Anodization of Titanium Foil: Phenol Red Diffusion," Journal of Physical Chemistry C, 111(41):14992-14997, Sep. 2007.

Shankar, K., et al., "Highly Efficient Solar Cells using TiO2 Nanotube Arrays Sensitized with a Donor-Antenna Dye," Nano Letters, 8(6):1654-1659, Jun. 2008.

Shankar, K., et al., "Highly-ordered TiO2 nanotube arrays up to 220 μm in length: Use in water photoelectrolysis and dye-sensitized solar cells," Nanotechnology, 18(6):065707.1-065707.11, Feb. 2007.

Würthner, F., "Perylene bisimide dyes as versatile building blocks for functional supramolecular architectures," Chemical Communications, 0(14):1564-1579, Jul. 2004.

Zhu, K., et al., "Enhanced charge-collection efficiencies and light scattering in dye-sensitized solar cells using oriented TiO2 nanotubes arrays," Nano Letters, 7(1):69-74, Jan. 2007.

Chen, X. et al. "Titanium Dioxide Nanomaterials: Synthesis. Properties, Modifications, and Applications," Chemical Reviews, vol. 107(7):2891-2959, Jun. 23, 2007.

Nakayama, K., et al., "TiO2 Nanotube Layers on Ti Substrates for High Efficiency Flexible Dye-Sensitized Solar Cells," Applied Physics Express, 112301-1 to 112301-3, Oct. 31, 2008.

Yoshida, Y., et al., "Transparent conductive oxide layer-less dye-sensitized solar cells consisting of floating electrode with gradient TiOx blocking layer," Applied Physics Letters, vol. 94(9):93301-93301, Mar. 3, 2009.

Supplementary European Search Report mailed on Mar. 19, 2013 for European Patent Application No. EP 10 76 25530 (3 pages).

* cited by examiner

THREE DIMENSIONAL DYE-SENSITIZED SOLAR CELLS WITH NANOSCALE ARCHITECTURES

BACKGROUND

Photovoltaics are largely based upon solid state materials, with silicon (Si) the central material for the vast majority of commercial cells. High purity silicon is very costly, which has so far limited the use of photovoltaics in energy conversion.

SUMMARY

Techniques, apparatus and systems are described for providing dye sensitized solar cells with three-dimensional nanostructured electrodes. In one aspect, an apparatus includes a high efficiency dye sensitized solar cell (DSSC). The DSSC includes three-dimensional nanostructured electrodes. The three-dimensional nanostructured electrodes can include a cathode; an electrolyte; and anode that includes titanium oxide ($TiO_2$) nanotubes arranged in a three-dimensional structure; and a photosensitive dye coated on the $TiO_2$ nanotubes.

Implementations can optionally include one or more of the following features. The anode can include $TiO_2$ nanotubes arranged on a surface of a metallic substrate having substrate faces oriented in the three-dimensional structure. The three-dimensional structure can include more than a horizontal plane. The metallic substrate can include a titanium (Ti) metallic substrate. The Ti metallic substrate of the anode can be shaped to form openings that allow facile transport of electrolyte through the anode. The openings can have dimensions ranging from nanometer to micrometer-sizes. The $TiO_2$ nanotubes can be front illuminated so as to have the cathode positioned opposite from the side of illumination. The anode can include $TiO_2$ nanotubes positioned perpendicular to a surface of the metallic Ti substrate. The $TiO_2$ nanotubes can be formed by anodization, and in an anatase-phase. The anode can include at least 10% of the $TiO_2$ nanotubes that are arranged in a horizontal configuration, such that the photon direction is orthogonal or roughly orthogonal to the orientation of the nanotube. The anode can include at least 20% of the $TiO_2$ that are arranged in a horizontal configuration. The anode can include a $TiO_2$ nanotube having an inner diameter in a range of 30 to 200 nanometers. The anode can include a $TiO_2$ nanotube having a length of at least 10 micrometers. The $TiO_2$ nanotubes can be positioned perpendicular to the local surface contour of a three-dimensional metallic structure comprising at least one of: Ti wire arrays or woven mesh; Ti sheets with perforations, slots, or vertical columns; vertically aligned straight Ti sheets; vertically aligned straight Ti wires; zig-zag vent Ti sheets; or slanted or accordion-shaped near-vertical Ti sheets.

Implementations can include one or more of the following limitations. The anode can include a photon absorption pathlength that exceeds electron transport distance. The photon absorption pathlength can be sufficiently long to allow effective use of the photosensitive dye comprising an organic dye or a dye mixture. The photon absorption pathlength can be decoupled from the electron transport in the anode that includes the $TiO_2$ nanotube three-dimensional structure. The anode can be configured to have distances for photon absorption exceeding the nanotube pathlength. The dye-sensitized solar cell can be constructed and made free of transparent conductive oxide (TCO) layer on glass. The dye-sensitized solar cell being constructed and made free of TCO can be configured to provide an dye sensitized solar cell efficiency of at least 4% in standard AM 1.5 solar illumination. The dye-sensitized solar cell being constructed and made free of TCO can be configured to provide dye sensitized solar cell efficiency of at least 8% in standard AM 1.5 solar illumination. The dye-sensitized solar cell being constructed and made free of TCO can be configured to provide dye sensitized solar cell efficiency of at least 12% in standard AM 1.5 solar illumination. The cathode can include at least one of: platinum foil, platinum coated Ti metal or a carbon-black electrode. The photosensitive dye can include a dye or a dye mixture having an extinction coefficient that exceeds approximately 50 M-1 cm-1 in a region within a solar emission spectrum. The photosensitive dye can include a dye or a dye mixture that absorbs over any portion of useful solar spectrum ranging from 300 nanometers to at least 1,500 nanometers.

Implementations can optionally include one or more of the following features. The described high-efficiency dye sensitized solar cells (DSSC) can have anodes with vertically or radially aligned $TiO_2$ nanotubes arranged in a three-dimensional architecture or structure. The three-dimensional structure can include at least one of a surface of Ti metal or alloy mesh careen, a vertically aligned straight Ti sheet, a zig-zag vent, a slanted or accordion-shaped near-vertical Ti sheet, a perforated Ti sheet, or a Ti wire array. The anode of the DSSC can include new type of dye or a mixture of dyes based on enhanced photon absorption pathlengths within the anode of the DSSC. The cathode can include Pt coated on a mesh screen or foil. The DSSC can include materials that are free of transparent conductive oxide (TCO) layers at both the anode and cathode.

In another aspect, a method includes constructing a dye-sensitive solar cell. Constructing a dye-sensitized solar cell includes electrochemically anodizing and annealing anatase structured $TiO_2$ nanotubes, and arranging the electrochemically anodized and annealed anatase structure on a surface of a metallic substrate in a three-dimensional structure. The three-dimensional structure is selected from Ti wire arrays, Ti woven mesh, Ti sheets with perforations, slots, or vertical columns, vertically aligned straight Ti sheets, vertically aligned straight Ti wires, zig-zag vent Ti sheets, and slanted or accordion-shaped near-vertical Ti sheets.

Implementations can optionally include one or more of the following features. The method can include growing the $TiO_2$ nanotubes in a three-dimensional array that is perpendicular to a local contour of the metal substrate, and having a nanotube diameter in a range of 30 to 200 nanometers and a length in a range of 10 to 1000 nanometers. The method can include using a Ti metal wire or a foil substrate as a conduit for photo-generated electrons from surfaces of the $TiO_2$ nanotubes protruding from a three dimensional Ti metal backbone without a conductive transparent glass. The surfaces of $TiO_2$ nanotubes can be dye coated.

The described techniques, apparatus and systems can potentially provide one or more of the following advantages. The DSSC described herein can include new architectures that do not require any transparent conductive oxide (TCO) on glass at either the anode or cathode electrode, which can result in an increase in efficiency, simplified design, and ease of scaling (metal has resistive losses that are orders of magnitude smaller than TCO). Moreover, because the TCO is one of the most costly components of a DSSC, the avoidance of this material can significantly reduce the overall costs of a DSSC. Additionally, the described techniques, apparatus and materials for implementing DSSCs can employ entirely environmental-friendly materials, and avoid the serious problem of Si shortage which has hindered the use of conventional solid-state photovoltaics. Also, the described photovoltaic cells do not need a clean-room for manufacture; therefore production of the cells has far less environmental impact than the manufacture of ultra-high purity semiconductors needed for solid-state photovoltaics, for example.

BRIEF DESCRIPTION OF DRAWINGS

FIGS. 7A and 7B show representative performance measurements and characterization of cells constructed with anodes of the type pictured in FIG. 3B, FIGS. 5A, 5B, 5C and FIGS. 6A, 6B and 6C.

DETAILED DESCRIPTION

Photovoltaics are largely based upon solid state materials, with silicon (Si) the central material for the vast majority of commercial cells. Silicon is an indirect-bandgap semiconductor, and its 1.1 eV bandgap is well-matched to the solar spectrum at the earth's surface. Cells that have efficiencies of nearly 20% can be obtained, and even higher efficiencies are measured in the laboratory setting. However, the low absorbance of crystalline Si (c-Si) requires that the active material be hundreds of microns thick for effective absorption of solar photons. A large portion of the cost of c-Si cells can be attributed directly to the need for large amounts of the high-purity Si. A number of alternatives to these cells utilize layers with far greater absorption than c-Si, and therefore these cells can efficiently capture sunlight with thicknesses closer to 10 microns. Most notable among these thin-film cells are amorphous silicon (a-Si) and the semiconductors cadmium telluride (CdTe), copper indium selenide (CIS) or copper indium selenide (CIGS). These materials have emerged commercially, but are still in need of further development because of stability, scarcity of the indium and tellurium, or concerns about environmental impact.

Another solar cell technology is based upon photoelectrochemistry and upon the absorption and excited state properties of dye molecules that are bound to a titanium dioxide ($TiO_2$) substrate. Cells of this type, initially reported by O'Regan and Grätzel in 1991, are now termed "Grätzel cells" or dye sensitized solar cells (DSSC). [See O'Regan, B.; Gratzel, M. Nature 1991, 353, 737-740.]. These cells use environmentally-friendly materials, enable ease of manufacture, and potentially provide low cost. [See Gratzel, M. Inorganic Chemistry 2005, 44, 6841-6851.]

Figure 1:
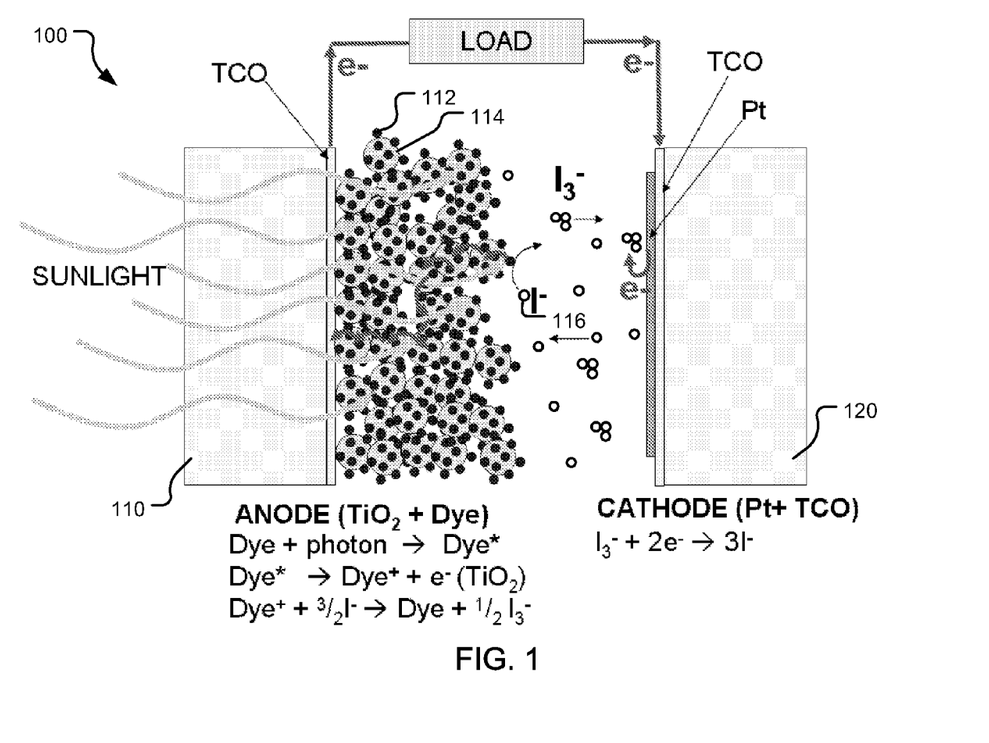
FIG. 1 is a schematic of a traditional DSSC. The $TiO_2$ anode is pictured on the left; small filled circles (dark blue) represent the light-absorbing dye that is covalently bound to $TiO_2$ (larger light blue circles). Small open dots not bound to $TiO_2$ represent either iodide ($I^-$) or triiodide ($I3^-$). TCO=transparent conductive oxide; and Pt=platinum catalyst.
Figure 2:
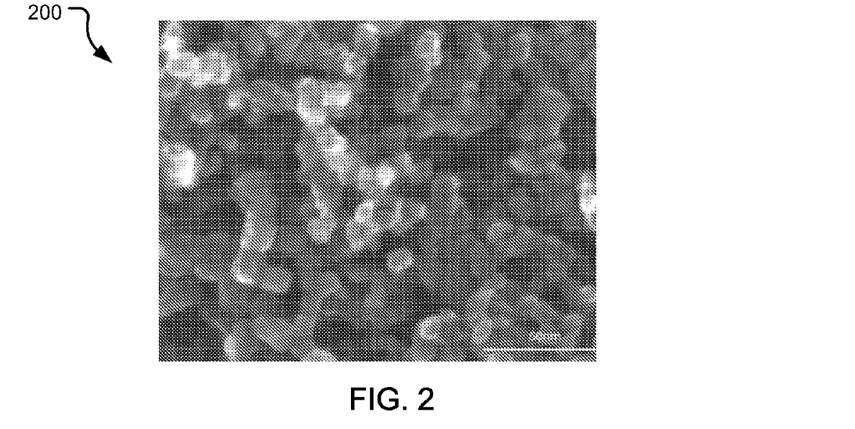
FIG. 2 shows a mesoporous layer of $TiO_2$ nanocrystals.

FIG. 1 shows a schematic of a typical DSSC 100. A $TiO_2$ anode 110 is pictured on the left with small filled circles 112 representing a light-absorbing dye that is covalently bound to $TiO_2$ 114. The single open dots 116 represent iodide ($I^-$) and the three attached open dots represent triiodide ($I_3^-$). TCO=transparent conductive oxide and Pt=platinum catalyst. Briefly, the dyes 112 attached to nanoparticles of $TiO_2$ 114 absorb photons and thus form excited-state dyes (Dye*). As shown in FIG. 1, all of the dye molecules 112 are bound to the $TiO_2$ and each of the dye molecule 112 could be excited or not. An excited molecule quickly ejects an electron to the $TiO_2$ nanoparticle, and the electron diffuses through the mesoporous $TiO_2$ network and eventually reaches the transparent conductive oxide (TCO) substrate. Electrons leave the anode 110, perform work on a load, and then reach the cathode 120, where the platinum (Pt) catalyst is available to enhance the regeneration of triiodide $I_3^-$ to iodide $I^-$ as denoted in FIG. 1. The function of the reduction-oxidation (redox) shuttle $I^-/I_3^-$ is to reduce the dye cations (Dye$^+$) 118 that form after electrons are injected in the $TiO_2$, thus regenerating neutral dye molecules that are then available to absorb photons once again. The initial cell had a reported efficiency of 7%, and at present, the best record is 11.2%. [See, M. K.; De Angelis, F.; Fantacci, S.; Selloni, A.; Viscardi, G.; Liska, P.; Ito, S.; Takeru, B.; Gratzel, M. G. Journal of the American Chemical Society 2005, 127, 16835-16847.] Both the original and current record-holding cell have the same basic architecture (see FIG. 1), with the anode 110 comprised of a mesoporous $TiO_2$ layer upon which ruthenium based-dyes are covalently bound as a light collector. FIG. 2 shows an example of a mesoporous $TiO_2$ layer 200. [from Gratzel, M. Inorganic Chemistry 2005, 44, 6841-6851.]

Electron transport in the mesoporous layer 200 is a relatively slow process in DSSCs, which leads to transport and recombination losses. [See Frank, A. J.; Kopidakis, N.; van de Lagemaat, J. Coordination Chemistry Reviews 2004, 248, 1165-1179; and Cao, F.; Oskam, G.; Meyer, G. J.; Searson, P. C. Journal of Physical Chemistry 1996, 100, 17021-17027.] Nanowires or nanotubes can provide improved charge transport in comparison with nanoparticles. ZnO nanowires were the topics of the first reports in 2005. [See Law, M.; Greene, L. E.; Johnson, J. C.; Saykally, R.; Yang, P. D. Nature Materials 2005, 4, 455-459; and Baxter, J. B.; Aydil, E. S. Applied Physics Letters 2005, 86, 3.] The authors of these studies highlighted that the improved transport properties of nanowires or nanotubes over the traditional mesoporous layer are the primary motivation to explore these types of anodes. However, the overall efficiencies in the early works was <2%, primarily because of low surface areas (low dye loading) of these initial studies. More recently, $TiO_2$ nanotubes have been explored in DSSCs with the highest efficiencies in the range of 6 to 7.6%. [See Chen, C. C.; Chung, H. W.; Chen, C. H.; Lu, H. P.; Lan, C. M.; Chen, S. F.; Luo, L.; Hung, C. S.; Diau, E. W. G. Journal of Physical Chemistry C 2008, 112, 19151-19157; and Varghese, O. K.; Paulose, M.; Grimes, C. A. Nature Nanotechnology 2009, 4, 592-597.]

The $TiO_2$ nanotube systems have led to important quantitative evidence that nanotubes offer significant charge transport advantages over nanoparticles, despite the overall lower cell performance. Specifically, $TiO_2$ nanotubes exhibit an order of magnitude slower charge recombination rate, and an approximately 10-fold greater diffusion length, relative to the common mesoporous $TiO_2$ nanocrystalline anode. [See Jennings, J. R.; Ghicov, A.; Peter, L. M.; Schmuki, P.; Walker, A. B. Journal of the American Chemical Society 2008, 130, 13364-13372; and Zhu, K.; Neale, N. R.; Miedaner, A.; Frank, A. J. Nano Letters 2007, 7, 69-74.]

The unique properties of nanotubes can allow new architectures for DSSCs. The transport advantages of nanotubes can allow use of anodes that are tens of nanometers thick, instead of the typical ~10 micron thickness of nanoparticle-based cells. The enhanced thickness with a lowered recombination rate is a major advantage, because the spectral regions where the dyes generally absorb weakly (e.g. near-infrared) can be counteracted with a longer photon absorption pathlength. Furthermore, the metal substrate to which the $TiO_2$ nanotubes are attached can improve conduction ~4 orders of magnitude in comparison with a transparent conductive oxide (TCO) layer. [See Onoda, K.; Ngamsinlapasathian, S.; Fujieda, T.; Yoshikawa, S. Solar Energy Materials and Solar Cells 2007, 91, 1176-1181; and Toivola, M.; Halme, J.; Miettunen, K.; Aitola, K.; Lund, P. D. International Journal of Energy Research 2009, 33, 1145-1160. The design and construction of large area or flexible cells based on nanotubes and metallic substrates can be much simpler than for traditional cells with TCO layers.

Techniques, apparatus and systems are described for providing dye sensitized solar cells with three-dimensional nanostructured electrodes. The described high-efficiency dye sensitized solar cells (DSSC) can have anodes with vertically or radially aligned $TiO_2$ nanotubes arranged in a three-dimensional architecture comprising the surface of Ti metal or perforated Ti sheets, or Ti wire arrays, vertically aligned straight Ti sheets, zig-zag vent, slanted, or accordion-shaped near-vertical Ti sheets. Also, the anode can incorporate new types of dyes or mixtures of dyes, as a result of enhanced photon absorption pathlengths of the anodes. The cathodes of the cells can include or consist of Pt coated on various metallic mesh screen or foil. The DSSC with three-dimensional nanostructured electrodes can be made of materials that that are free of transparent conductive oxide (TCO) on glass layers at both the anode and cathode.

The $TiO_2$ nanotubes and Ti metal substrate to which the nanotubes have solid contacts provide a direct and low-resistance conduit to capture electrons at the anode. At the same time, the nanotubes provide a very high surface area for covalently binding inorganic or organic sensitizers. The $TiO_2$ nanotubes can be formed by anodization. The work of Grimes and others have provided many insights into the anodization processes, for example techniques that allow tubes to grow to lengths that even exceed 1000 microns (1 mm). [See Paulose, M.; Prakasam, H. E.; Varghese, O. K.; Peng, L.; Popat, K. C.; Mor, G. K.; Desai, T. A.; Grimes, C. A. Journal of Physical Chemistry C 2007, 111, 14992-14997.] Methods for growing the tubes directly on a conductive glass substrate, rather than a titanium metal substrate have also led to reports of frontside illuminated cells. [See Grimes, C. A. Journal of Materials Chemistry 2007, 17, 1451-1457; and Shankar, K.; Bandara, J.; Paulose, M.; Wietasch, H.; Varghese, O. K.; Mor, G. K.; LaTempa, T. J.; Thelakkat, M.; Grimes, C. A. Nano Letters 2008, 8, 1654-1659.]

Nanotubes for the DSSC described herein can be grown with a desired diameter substantially in the range of 20-500 nanometers, with some implementations providing the diameter substantially in the range of 30-200 nanometers. For example, the nanotubes can be grown to have an inner diameter that is substantially 110 nanometers (nm) in size. Also, nanotubes can have an outer diameter that is substantially 160 nm. Moreover, nanotubes can be grown to have a wall thickness of 25 nm. Additionally, nanotubes can be grown to have a length in a range of 10-40 micrometer. However, the length can be in a range of 10-1000 micrometers, with some implementations providing a length in the range of 10-100 micrometers. For example, for tubes ~25 micrometers long and with inner diameter 110 nm and wall thickness 25 nm, the roughness factor is ~1000-fold greater than the area of the metal substrate. Light can be effectively absorbed, even into the near-IR region, because the pathlength of the $TiO_2$ nanotube layer is significantly greater than the thickness of the mesoporous $TiO_2$ layer of traditional DSSCs. The DSSC solar cells as described herein include new architectures that do not use any transparent conductive glass at either electrode, which results in an increase in efficiency, simplified design, and ease of scaling because TCO has resistive losses that are far greater than for a metal. Moreover, because the TCO is one of the most costly components of a solar cell, the avoidance of this material can reduce the overall costs associated with a DSSC.

Figure 3A:
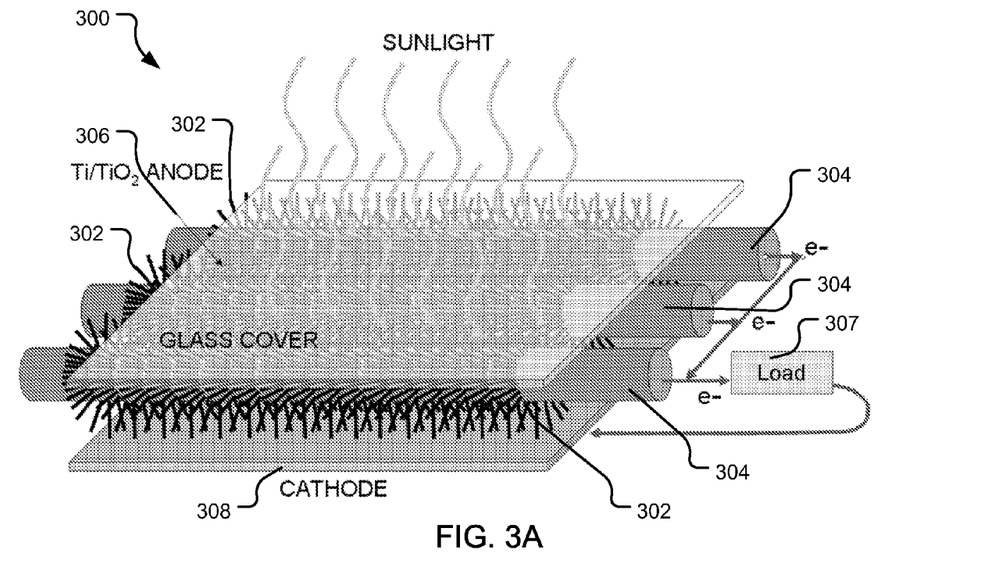
FIG. 3A shows a schematic of one design of a DSSC with a 3-D anode architecture. $TiO_2$ nanotubes are grown radially around Ti wires (grey). Electron transport is directly from $TiO_2$ nanotubes to the Ti wires, through the external circuit and to the cathode.
Figure 3B:
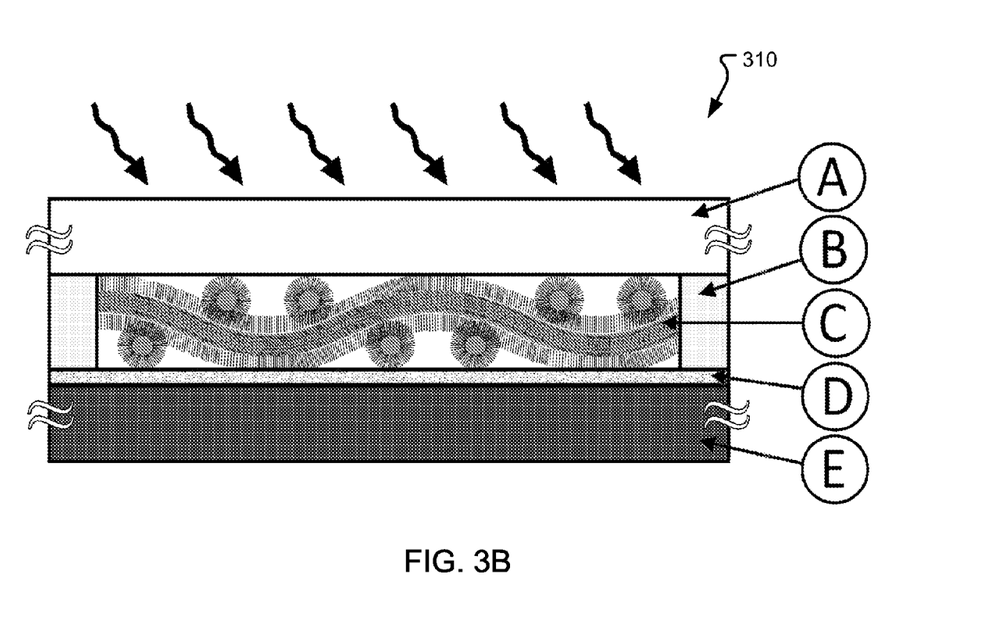
FIG. 3B shows another 3-D design of DSSC cells, $TiO_2$ nanotubes are grown from all surfaces of a Ti metal mesh. A cell of this type has been constructed in our lab.
Figure 3C:
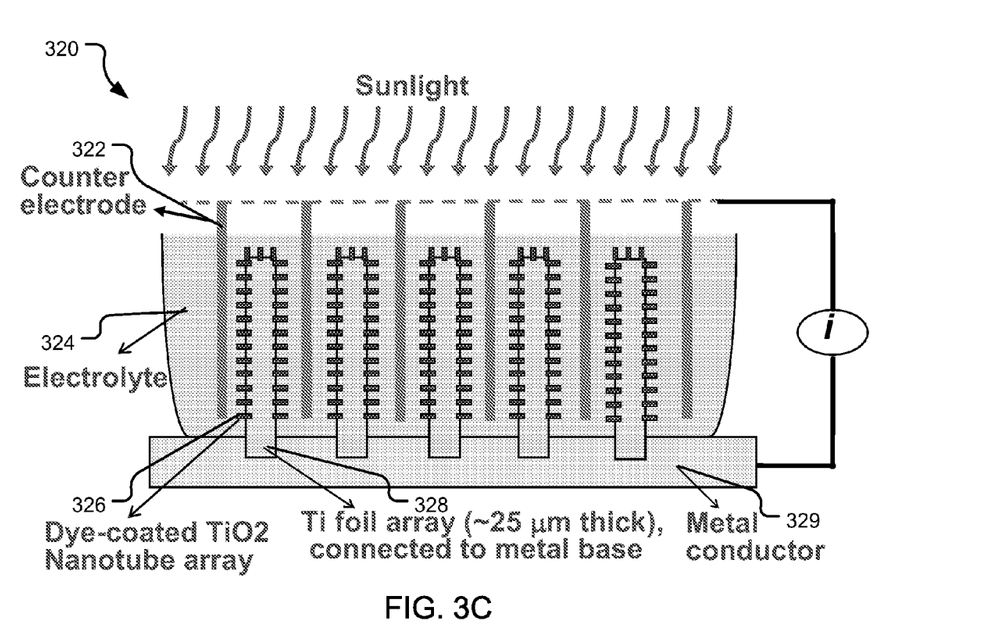
FIG. 3C shows an alternative 3-D design with the majority of $TiO_2$ nanotubes oriented horizontally from vertical columns or wires of Ti metal. Thus most nanotubes are oriented orthogonal or nearly orthogonal to the incident photon direction.

The three-dimensionally architectured DSSC solar cells, according to some of the exemplary embodiments, are illustrated in FIGS. 3A, 3B, and 3C. FIG. 3A shows a schematic of one example design of a DSSC 300 that uses a 3-D anode architecture. $TiO_2$ nanotubes are grown on a metallic substrate. For example, the metallic substrate can include Ti substrate. Also, the metallic substrate can consist of Ti. Also, the metallic substrate can be for different structures or forms. For example, $TiO_2$ nanotubes 302 can be grown (e.g., radially) around Ti wires 304 to form an anode 306. Electron transport is directly from the $TiO_2$ nanotubes 302 to the Ti wire 304, through the external circuit 307 and to the cathode 308.

FIG. 3B shows a schematic of a 3-D cell 310 based upon a Ti metal mesh architecture. The 3-D anode and $TiO_2$ nanotubes are grown from all surfaces of the wire grid. An upper transparent glass layer is labeled (A), a Ti metal mesh is labeled (C) and Pt coated Ti metal cathode is labeled (E).

FIG. 3C shows another example 320 of a 3-D design of DSSC cells using $TiO_2$ nanotubes that are largely horizontally oriented and grown off of vertical Ti columns or wire grid arrays. A metallic substrate (e.g., Ti foil array) 328 is connected to a metal conductor 329. A dye coated $TiO_2$ nanotube array 326 is grown on a surface of the metallic substrate 328 to form a 3-D anode. The Ti foil array 328 with the dye coated $TiO_2$ nanotube array is in contact with an electrolyte 324. In addition, a counter electrode 322 is provided to complete an electrical circuit.

As can be seen from FIGS. 3A, 3B and 3C, the Ti metal wire or foil substrates serve as conduit for electrons from the $TiO_2$ nanotubes protruding from the three dimensional Ti metal backbone, and therefore the need for costly conductive glass is eliminated. The fact that the cell has only window glass between the surroundings and the photoactive anode is a significant advance, and can lead to higher efficiencies relative to prior reports. In the current design, Pt foil can serve as the cathode. However, other materials can be used for the cathode, such as a Pt coated Ti metal or a carbon-black electrode. [See Murakami, T. N.; Ito, S.; Wang, Q.; Nazeeruddin, M. K.; Bessho, T.; Cesar, I.; Liska, P.; Humphry-Baker, R.; Comte, P.; Pechy, P.; Gratzel, M. Journal of the Electrochemical Society 2006, 153, A2255-A2261.]

The described techniques can be used to increase the length of the nanotubes, and therefore the absorption pathlength of the dye as seen from the direction of the solar photons. As described above, the nanotubes can be grown to have a length in a range of 10-40 micrometers. However, the length can be in a range of 10-1000 micrometers, with some implementations providing a length in the range of 10-100 micrometers. The additional pathlength can allow the use of photosensitive dyes that have smaller extinction coefficients (absorption cross-section) in various regions of the UV-Vis-NIR spectrum. [See Jennings, J. R.; Ghicov, A.; Peter, L. M.; Schmuki, P.; Walker, A. B. Journal of the American Chemical Society 2008, 130, 13364-13372.] For example, the photosensitive dye used can include a dye or a dye mixture having an extinction coefficient even as low as ~50 $M^{-1}cm^{-1}$ in a region within a solar emission spectrum, and nonetheless a significant fraction of these photons could be harvested. The photosensitive dye can include a dye or dye mixture that can absorb over any portion of useful solar spectrum ranging from 300 nanometer to at least 1,500 nanometer, for example.

Figure 4A:
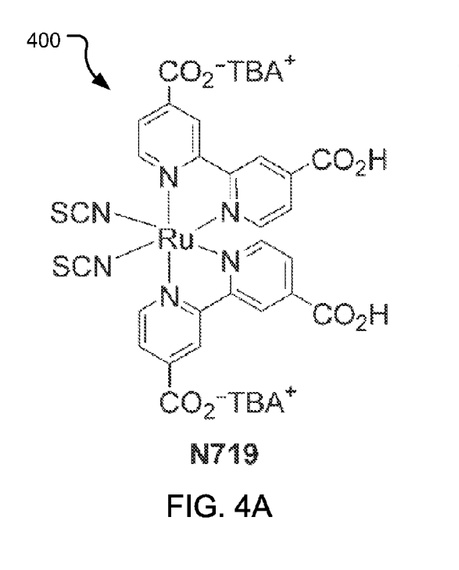
FIG. 4A shows a representative inorganic dye "N719" that is commonly used in DSSCs.
Figure 4B:
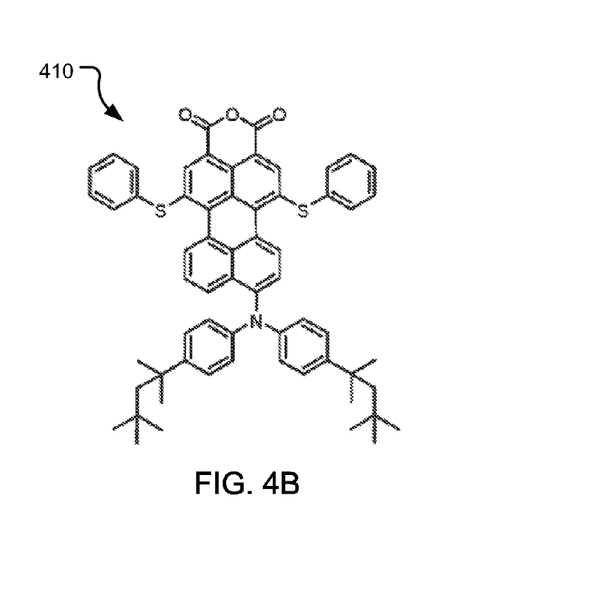
FIG. 4B shows a representative organic dye with perylene core.
Figure 5A:
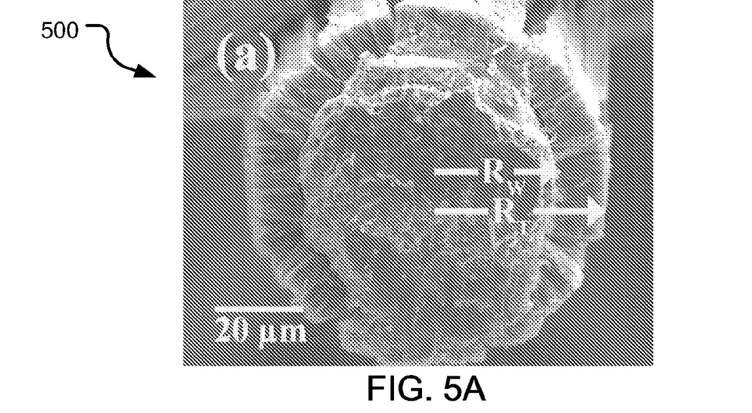
FIGS. 5A, 5B and 5C show scanning electron microscopy (SEM) images of $TiO_2$ nanotube mesh anode views that show the high surface area nanotube structure.
Figure 5B:
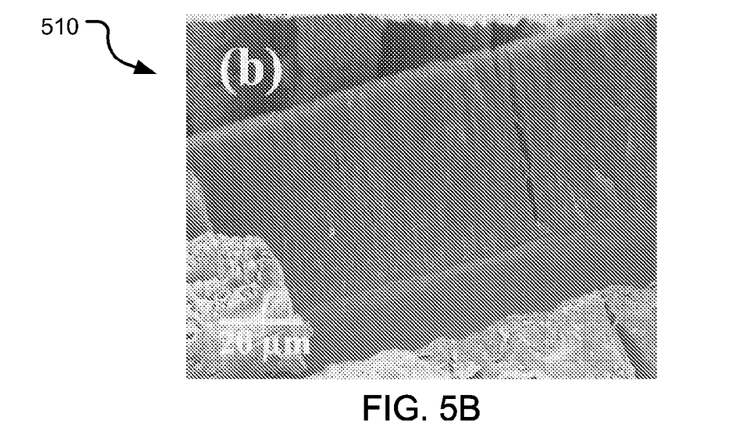
Figure 5C:
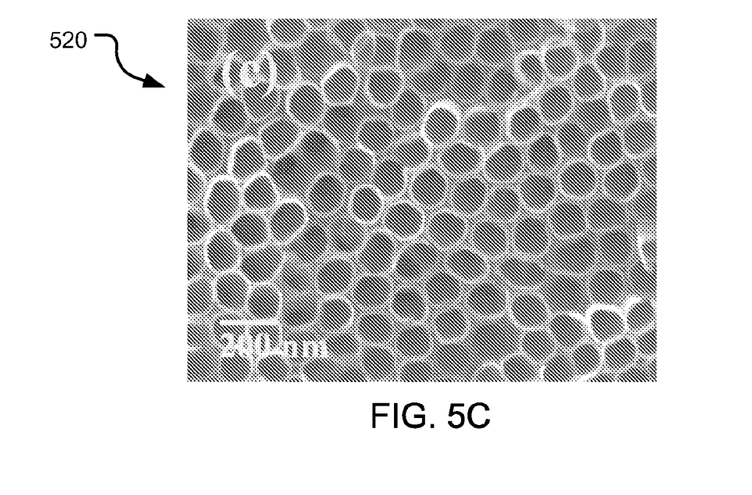
Figure 6A:
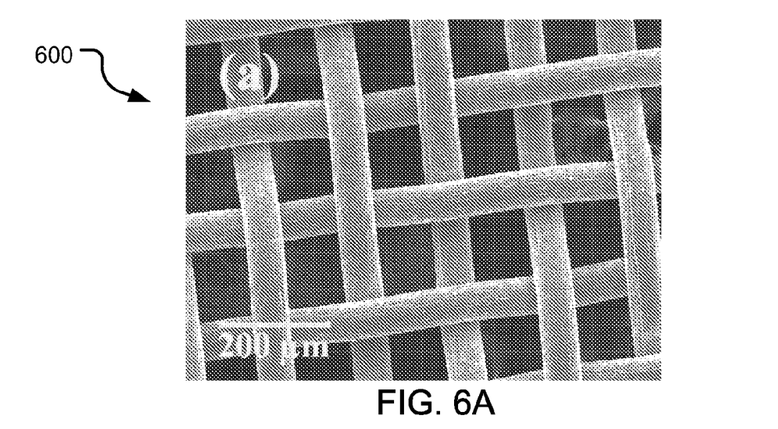
FIGS. 6A, 6B and 6C show low-magnification SEM images of a representative 3-D $TiO_2$ nanotube mesh anode: (a) before anodization (b) with nanotubes 16 μm long and (c) with nanotubes 42 μm long.
Figure 6B:
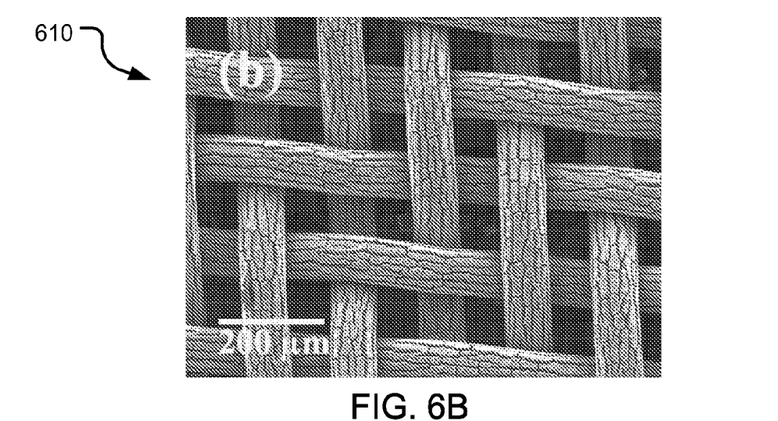
Figure 6C:
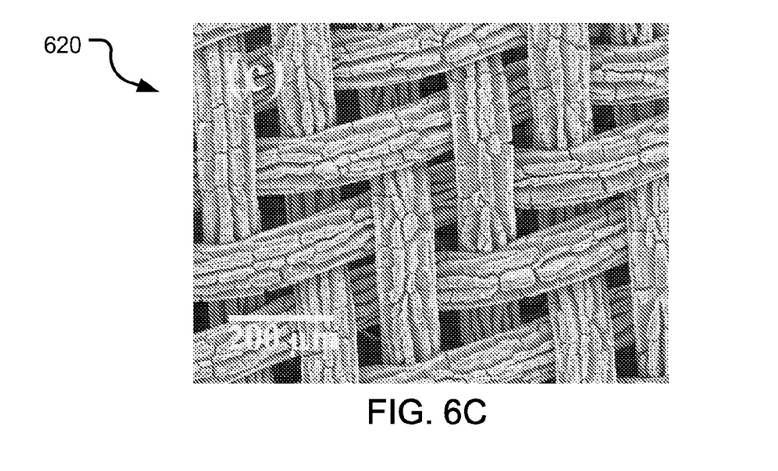

Furthermore, mixtures of dyes are feasible, since each would have sufficient absorption pathlength for effective absorption in various regions of the solar spectrum. Mixtures could include inorganic dyes, such as the commonly used ruthenium bypyridyl dye "N719" as shown in FIG. 4A or aromatic organic dyes such as the perylene diimide dye illustrated in FIG. 4B. Perylene-based dyes are well known to be robust, and easily modifiable so that the absorption spectrum can be tuned from the visible into the near-IR. [See Wurthner, F. Chemical Communications 2004, 1564-1579.] Perylene-based dyes can be incorporated in DSSCs that have the traditional mesoporous $TiO_2$ layer, and an excellent overall efficiency of 6.8% can be obtained with the dye illustrated in FIG. 4B. [See Li, C.; Yum, J.-H.; Moon, S.-J.; Herrmann, A.; Eickemeyer, F.; Pschirer, N. G.; Erk, P.; Schoneboom, J.; Mullen, K.; Gratzel, M.; Nazeeruddin, M. K. ChemSusChem 2008, 1, 615-8.] The synthetic procedures for making large quantities of this dye are straightforward.

DSSCs—Tangible Results

Photovoltaic cells as described in this specification can incorporate an array of upright $TiO_2$ nanotubes and ruthenium dyes. Nanotubes up to 40 microns in length have been grown off of Ti wires and Ti wire mesh by controlled anodization. FIGS. 5A, 5B, 5C, 6A, 6B and 6C show Scanning Electron Microscopy (SEM) views 500, 510, 520, 600, 610 and 620 respectively of $TiO_2$ nanotubes on Ti wire and wire mesh. The nanotubes shown in the views have an outer diameter of ~160 nm, as highlighted in FIG. 5C. The length and the diameter of the nanotube arrays, as well as the hierarchical 3-D configurations of the DSSC can be optimized to improve the DSSC solar cell efficiency. Typical length and diameter of the nanotube arrays grown for the describe DSSCs have been described in the previous paragraphs. In particular, the DSCCs described herein can separate the photon absorption pathlength from the electron transport distance. For example, as shown in the schematic of FIG. 3C, the stack of horizontally-oriented tubes can be made much taller than the length of the nanotubes. The photons are collected over the entire stack length, yet the electron transport distance would not exceed the length of the nanotube itself. The decoupling of electron transport from photon absorption can mean that the photons are more efficiently harvested than in other designs, and that electron transport losses are minimized.

Figure 7A:
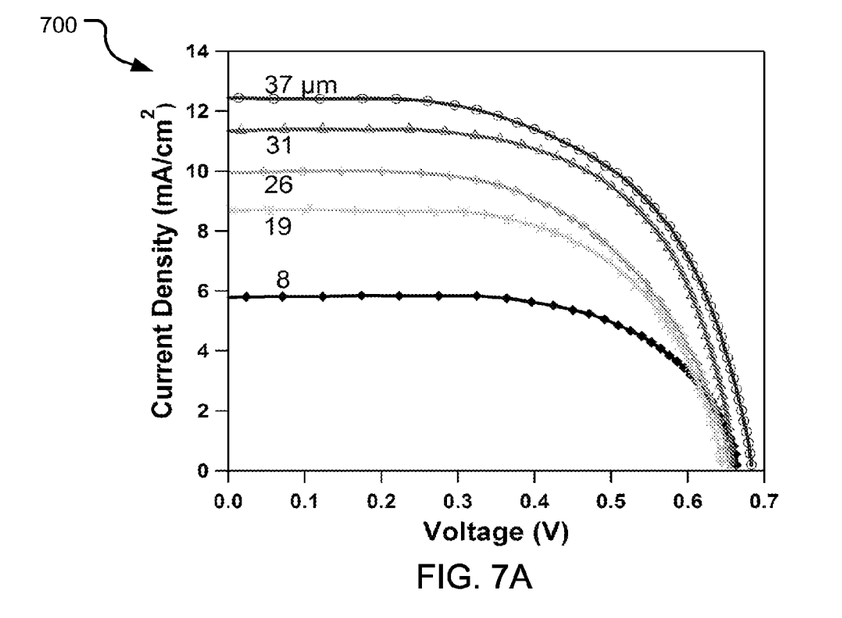
FIG. 7A shows Current-Voltage curves under AM 1.5 G solar illumination.
Figure 7B:
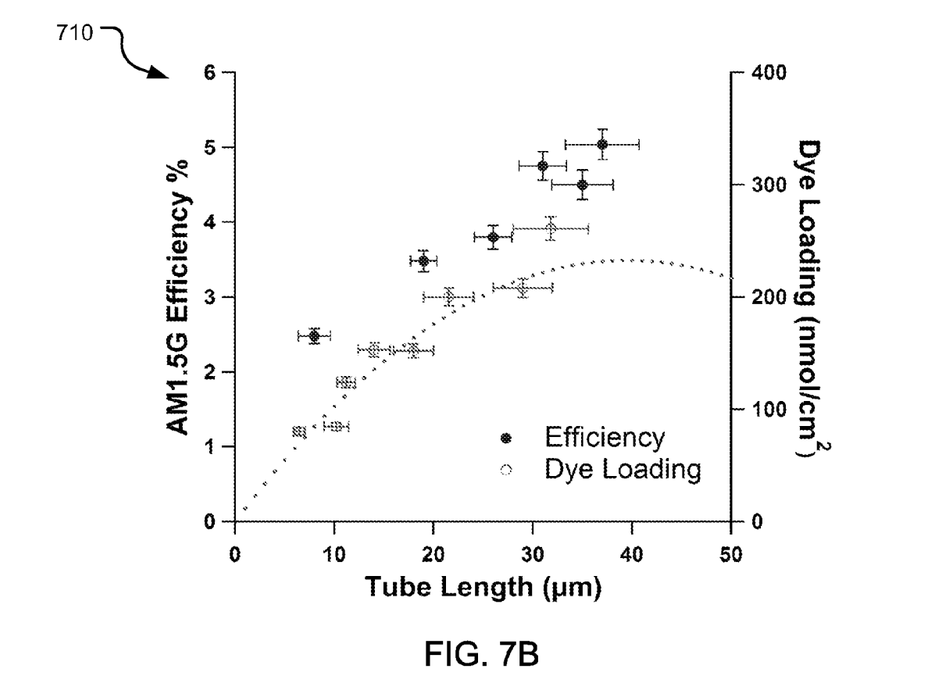
FIG. 7B shows DSSC nanotube/mesh cell efficiencies under AM 1.5 G solar illumination, and dye loading, as a function of tube length. The curve is based upon a model that assumes smooth walls for the $TiO_2$ nanotubes.

FIGS. 7A and 7B are graphs 700 and 710 that show representative performance measurements and characterization of cells constructed with anodes of the type pictured in FIG. 3B, FIGS. 5A, 5B, 5C and FIGS. 6A, 6B and 6C. The graph 700 in FIG. 7A shows Current-Voltage curves under AM 1.5 G solar illumination show an open circuit voltage of 0.68 V, and a short-circuit current of 12 mA. The graph 710 in FIG. 7B shows DSSC nanotube/mesh cell efficiencies under AM 1.5 G solar illumination, and dye loading, as a function of tube length. The best overall cell efficiency of 5.0% (measured in standard AM 1.5 solar illumination) shown in FIG. 7B is representative and is comparable with the best efficiencies reported in the literature for nanotube-based DSSCs. The curve fit for the dye loading is based upon a model that assumes smooth walls for the TiO2 nanotubes. The close match of the data and the fit reveals that the $TiO_2$ nanotubes of the mesh are well-covered with dye.

Figure 8:
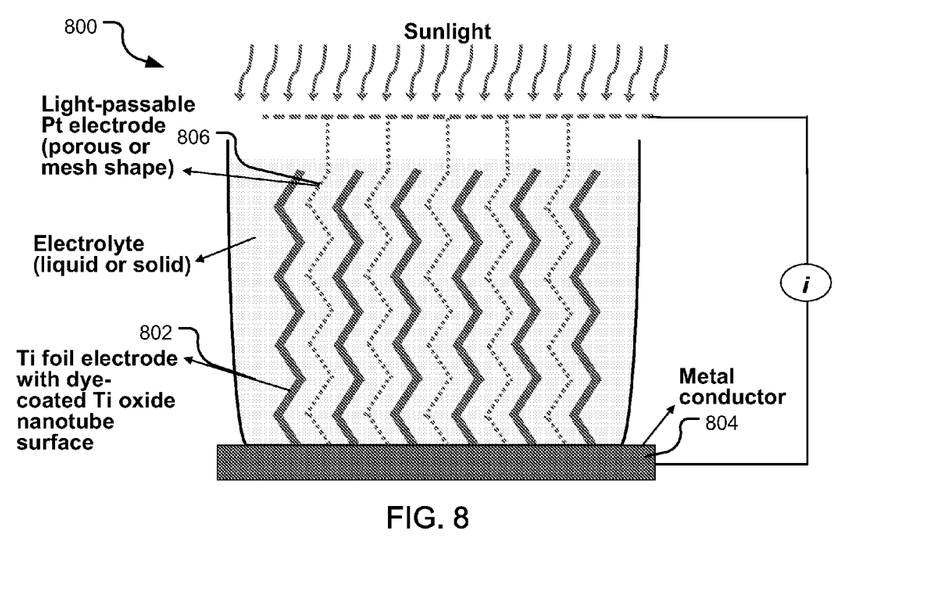
FIG. 8 shows accordion-geometry dye sensitized solar cells with $TiO_2$ nanotube array.

In another aspect, zig-zag or accordion shaped anode structure 800 can be used in combination with a transparent or partially transparent Pt electrode as depicted in FIG. 8. The $TiO_2$ nanotubes are anodized on the Ti foil surface to form Ti foil electrodes with dye-coated Ti oxide nanotube surface 802. The Ti foil electrodes 802 are solidly connected to the base metal (e.g., Ti) conductor 804 for easy electron extraction with minimal IR loss. The nanoscale distance between $TiO_2$ and Pt electrodes enables rapid electron collection before recombination. Vertical sunlight can undergo multiple reflections in an accordion-shaped Ti foil electrode. The extra pathlength caused by such reflections can enhance the photon absorption and harvesting. Optionally the Pt foil can have ~10-30% area of perforation holes (e.g., slots, pores, or other openings) 806 to allow some light passage to reach other anode Ti layers underneath.

Figure 9:
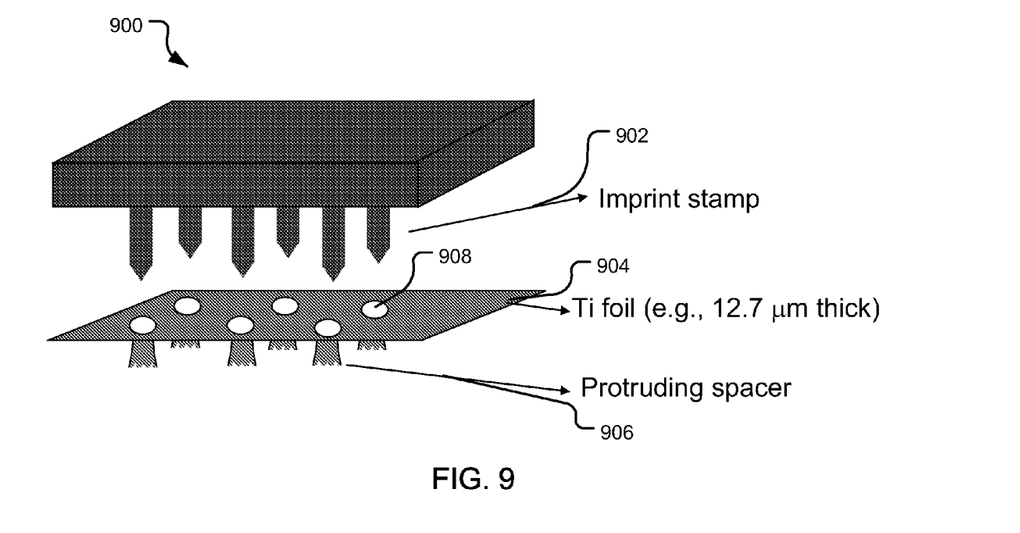
FIG. 9 shows imprint or indentation fabrication of protruding spacers for DSSC electrode arrays using sharp pointed stamp to punch out microscale structures.

In yet another aspect, localized micrometer scale bumps or punctures can be introduced on the anode Ti foil by various methods of nano or micro indentation or puncturing as shown in the diagram 900 of FIG. 9. The surface features can also allow adjacent placement of anodes and cathodes, while minimizing their spacing for highest possible electrode density and DSSC efficiency. For example, with a ~12 μm thick Ti foil 904, a 10-50 μm diameter stamp pillar array indenter 902 can be utilized to form an array of holes 908. The punctured Ti foil 904 is then anodized to form 30-100 nm diameter $TiO_2$ nanotubes on all the surfaces. The protruding structure 906, with proper insulation, can conveniently be used as built-in spacers to keep the neighboring Ti foils spaced apart from each other without overlapping, so that the electrolyte contacts all available $TiO_2$ nanotube surfaces. A macroscopic large area stamp made of Si can easily be fabricated using photolithography, with the pillar or pointed pillar tips carbonized into mechanically strong SiC, or sputter coated with hard coating of tungsten carbide or molybdenum carbide for mechanical durability on repeated use during manufacturing processes.

Figure 10A:
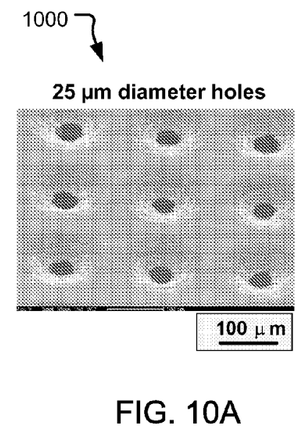
FIGS. 10A, 10B and 10C show perforated Ti foil anodes constructed by patterned etching.
Figure 10B:
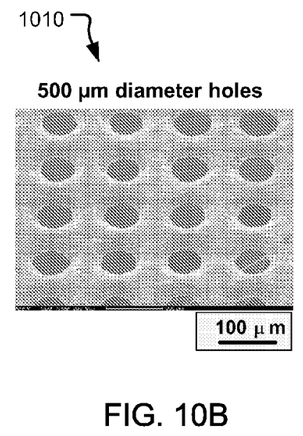
Figure 10C:
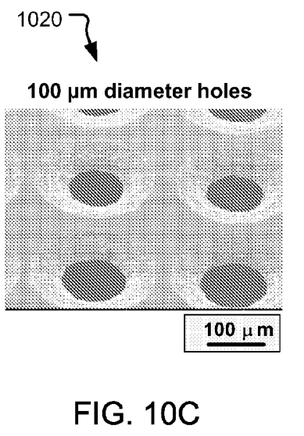

Additionally, similar anodes can be constructed with perforations in foil by patterned etching. FIGS. 10A, 10B and 10C show examples of perforated Ti foils 1000, 1010 and 1020 formed by patterned etching.

Figure 11A:
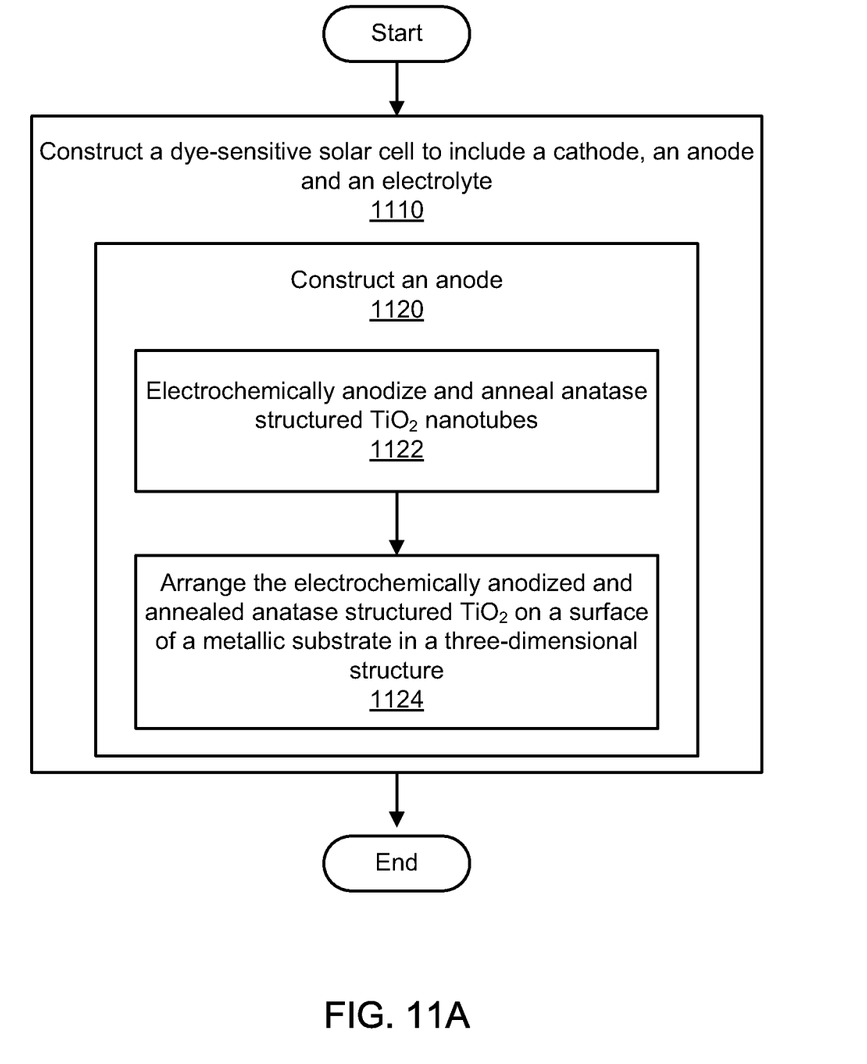
FIGS. 11A, 11B and 11C are process flow diagrams showing a process for constructing a dye-sensitive solar cell.
Figure 11B:
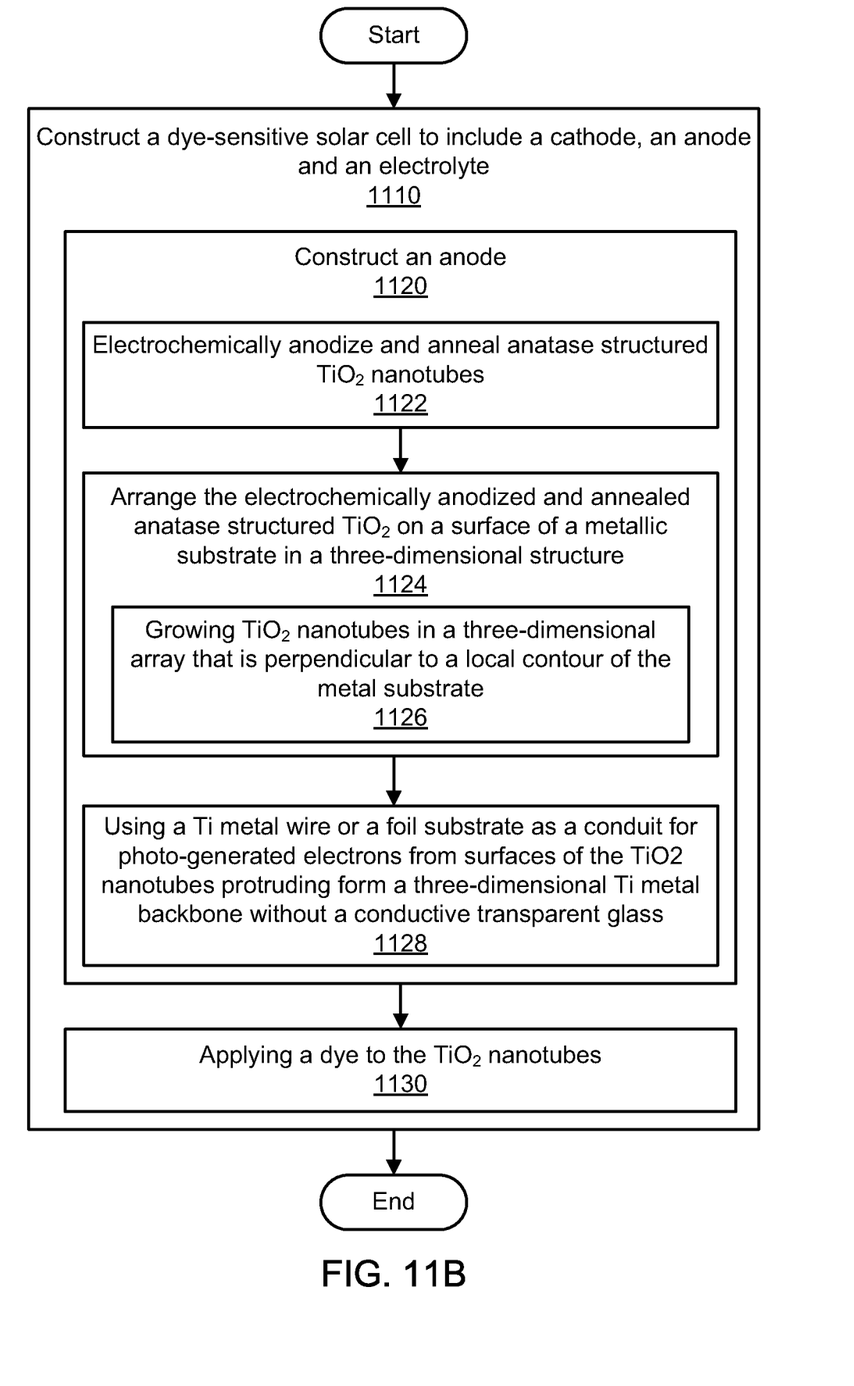
Figure 11C:
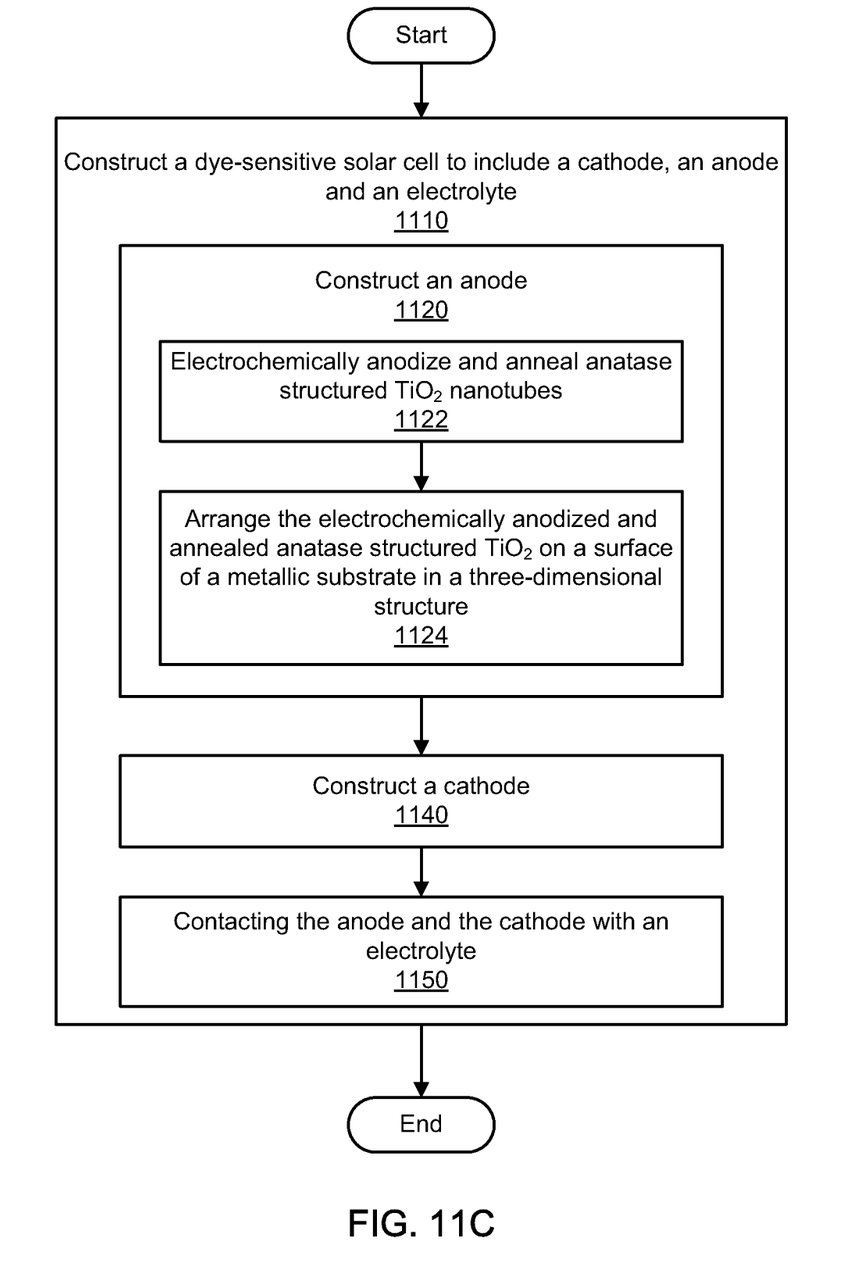

FIGS. 11A, 11B, 11C are process flow diagrams of a process 1100 for constructing a dye-sensitive solar cell. In one aspect, a dye-sensitive solar cell is constructed to include a cathode, an anode and an electrolyte (1110). Constructing the dye-sensitive solar cell includes constructing an anode (1120), which includes electrochemically anodizing and annealing anatase structured $TiO_2$ nanotubes (1122). Also, the electrochemically anodized and annealed anatase structured $TiO_2$ nanotubes are arranged on a surface of a metallic substrate in a three-dimensional structure (1124). The three-dimensional structure is selected from Ti wire arrays, Ti woven mesh, Ti sheets with perforations, slots, or vertical columns, vertically aligned straight Ti sheets, a vertically aligned straight Ti wire, zig-zag vent Ti sheets, and slanted or accordion-shaped near-vertical Ti sheets.

The $TiO_2$ nanotubes can be grown in a three-dimensional array that is perpendicular to a local contour of the metal substrate (1126). The $TiO_2$ nanotubes can be grown to have a nanotube diameter in a range of 30 to 200 nanometers and a length in a range of 10 to 1000 nanometers. A Ti metal wire or a foil substrate can be used as a conduit for photo-generated electrons from surfaces of the $TiO_2$ nanotubes protruding from a three-dimensional Ti metal backbone without a conductive transparent glass (1128). A dye can be applied to the $TiO_2$ nanotubes (1130).

Constructing the dye-sensitive solar cell can include constructing a cathode (1140) and contacting the cathode and the anode with an electrolyte (1150) as shown in FIG. 11C. Also, as described above, the cathode can include at least one of: platinum foil, platinum coated Ti metal or a carbon-black electrode. The photosensitive dye can include a dye or a dye mixture having an extinction coefficient that exceeds approximately 50 $M^{-1}$ $cm^{-1}$ in a region within a solar emission spectrum. The dye can include a photosensitive dye or a dye mixture that can absorbs over any portion of useful solar spectrum ranging from 300 nanometers to at least 1,500 nanometers.

While this document contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Only a few implementations and examples are described and other implementations, enhancements and variations can be made based on what is described and illustrated in this application.

What is claimed is:

1. An apparatus comprising:
a dye-sensitized solar cell comprising at least one three-dimensional nanostructured electrode, wherein the dye-sensitized solar cell comprising the at least one three-dimensional nanostructured electrode comprises:
a cathode;
an electrolyte;
an anode that comprises titanium dioxide ($TiO_2$) nanotubes arranged in a three-dimensional structure that is shaped to separate photon absorption pathlength in the anode from electron transport distance in the anode, the photon absorption pathlength corresponding to pathlength that a particular photon incident on the anode travels before being absorbed, the anode comprising a plurality of electrodes each covered with a plurality of the nanotubes, the plurality of electrodes forming a uniform group of parallel electrodes, wherein each electrode within the uniform group of parallel electrodes has a zig-zag or accordion shape provides complete physical separation from an adjacent electrode, the uniform group of parallel electrodes being that vertically oriented with respect to, and connected to, a base, such that incident light on the dye-sensitized solar cell reaches a first set of one or more nanotubes on the plurality of electrodes before undergoing multiple reflections due to the zig-zag or accordion shape, and reaching a second set of one or more nanotubes on the plurality of electrodes to produce a particular photon absorption pathlength extending over a plurality of the $TiO_2$ nanotubes that exceeds the electron transport distance; and
a photosensitive dye coated on the anode.

2. The apparatus of claim 1, wherein the anode comprises $TiO_2$ nanotubes arranged on a surface of a metallic substrate having faces oriented in the three-dimensional structure.

3. The apparatus of claim 2, wherein the three-dimensional structure comprises more than a horizontal plane.

4. The apparatus of claim 2, wherein the metallic substrate comprises a titanium (Ti) metallic substrate.

5. The apparatus of claim 4, wherein the Ti metallic substrate of the anode is shaped to form openings that allow facile transport of electrolyte ions throughout an anode area.

6. The apparatus of claim 5, wherein the openings comprise nanometer to micrometer-sized pores.

7. The apparatus of claim 5, wherein the $TiO_2$ nanotubes are front illuminated so as to have the cathode positioned opposite from the side of illumination.

8. The apparatus of claim 4, wherein the anode comprises $TiO_2$ nanotubes positioned perpendicular to a surface of the metallic Ti substrate.

9. The apparatus of claim 2, wherein the $TiO_2$ nanotubes are formed by anodization, and in an anatase-phase.

10. The apparatus of claim 2, wherein the anode comprises at least 10% of the $TiO_2$ nanotubes that are arranged in a horizontal configuration, such that photon direction is orthogonal or roughly orthogonal to the orientation of the $TiO_2$ nanotubes.

11. The apparatus of claim 2, wherein the anode comprises at least 20% of the $TiO_2$ nanotubes that are arranged in a horizontal configuration.

12. The apparatus of claim 2, wherein the anode comprises a TiO$_2$ nanotube having an inner diameter in a range of 30 to 200 nanometers.

13. The apparatus of claim 2, wherein the anode comprises a TiO$_2$ nanotube having a length of at least 10 micrometers.

14. The apparatus of claim 2, wherein the said TiO$_2$ nanotubes are positioned perpendicular to the local surface contour of a three-dimensional metallic structure comprising at least one of:

Ti wire arrays or woven mesh; or

Ti sheets with perforations, or slots.

15. The apparatus of claim 1, wherein the photon absorption pathlength is sufficiently long to allow effective use of the photosensitive dye comprising an organic dye or a dye mixture.

16. The apparatus of claim 1, wherein the photon absorption pathlength is decoupled from the electron transport in the anode that comprises the TiO$_2$ nanotube three-dimensional structure.

17. The apparatus of claim 1, wherein the anode is configured to have distances for photon absorption which exceed the nanotube pathlength.

18. The apparatus of claim 1, wherein the dye-sensitized solar cell is constructed and made free of transparent conductive oxide (TCO) layer on glass.

19. The apparatus of claim 18, wherein the dye-sensitized solar cell being constructed and made free of TCO, is configured to provide dye sensitized solar cell efficiency of at least 4%.

20. The apparatus of claim 18, wherein the dye-sensitized solar cell being constructed and made free of TCO, is configured to provide dye sensitized solar cell efficiency of at least 8% in standard AM 1.5 solar illumination.

21. The apparatus of claim 18, wherein the dye-sensitized solar cell being constructed and made free of TCO is configured to provide dye sensitized solar cell efficiency of at least 12% in standard AM 1.5 solar illumination.

22. The apparatus of claim 1, wherein the cathode comprises at least one of:

platinum foil, platinum-coated Ti metal, or a carbon-black electrode.

23. The apparatus of claim 1, wherein the photosensitive dye comprises a dye or a dye mixture having an extinction coefficient that exceeds approximately 50 M-1cm-1 in a region within a solar emission spectrum.

24. The apparatus of claim 23, wherein the photosensitive dye comprises a dye or dye mixture that can absorb over any portion of useful solar spectrum ranging from 300 nanometer to at least 1,500 nanometer.

25. An apparatus comprising:

a dye-sensitized solar cell comprising:

a cathode;

an electrolyte;

an anode that comprises titanium dioxide (TiO$_2$) nanotubes arranged in a three-dimensional structure that is shaped to separate photon absorption pathlength in the anode from electron transport distance in the anode, the anode comprising an array of metal electrodes each covered with a plurality of nanotubes and forming a uniform group of parallel electrodes that are connected to a metal base, each electrode within the uniform group of parallel electrodes having a zig-zag shape that provides complete physical separation from an adjacent electrode such that incident light on the dye-sensitized solar cell first reaches a first set of one or more nanotubes of the plurality of nanotubes on the zig-zag shaped electrodes before undergoing multiple reflections from the zig-zag shaped electrodes, propagating within the three dimensional structure and reaching a second set of one or more nanotubes of the plurality of nanotubes, thereby producing a photon absorption pathlength extending over a plurality of the TiO$_2$ nanotubes that exceeds an electron transport distance of a single TiO$_2$ nanotube; and a photosensitive dye coated on the anode.

* * * * *